United States Patent [19]

Williams

[11] Patent Number: 5,414,292

[45] Date of Patent: May 9, 1995

[54] JUNCTION-ISOLATED FLOATING DIODE

[75] Inventor: Richard K. Williams, Cupertino, Calif.

[73] Assignee: Siliconix incorporated, Santa Clara, Calif.

[21] Appl. No.: 67,372

[22] Filed: May 26, 1993

[51] Int. Cl.⁶ .......................................... H01L 29/764
[52] U.S. Cl. ..................... 257/373; 257/206; 257/495
[58] Field of Search ............... 257/204, 206, 350, 357, 257/371, 551, 370, 372, 373, 549

[56] References Cited

U.S. PATENT DOCUMENTS

| | | | |
|---|---|---|---|
| 4,825,175 | 4/1989 | Tomassetti | 257/371 |
| 4,877,749 | 10/1989 | Quigg | 257/335 |
| 4,975,764 | 12/1990 | Hsu | 257/370 |
| 5,014,105 | 6/1991 | Hata et al. | 257/371 |
| 5,060,037 | 10/1991 | Rountree | 257/357 |

Primary Examiner—Robert P. Limanek
Assistant Examiner—David B. Hardy
Attorney, Agent, or Firm—Skjerven, Morrill, MacPherson, Franklin & Friel

[57] ABSTRACT

A diode implemented in a junction isolated process protected from minority carrier substrate injection is disclosed. In a preferred embodiment, a diode includes an N+ cathode region and a P+ anode region formed in a P epitaxial region, and an N+ isolation region enclosing the epitaxial region. A CMOS inverter connected to the cathode region shorts the isolation region to either the cathode or the grounded substrate, depending on the voltage at the cathode, and thereby prevents minority carrier injection into the substrate in all conditions.

22 Claims, 8 Drawing Sheets

JUNCTION-ISOLATED FLOATING DIODE

FIELD OF THE INVENTION

This invention relates to a PN junction diode formed on a semiconductor substrate, and in particular to a floating PN junction diode which is implemented in a junction-isolated process and protected against minority carrier injection into the substrate.

BACKGROUND OF THE INVENTION

In integrated circuit technology, it is known to form devices in a semiconductor substrate or epitaxial layer because those formed on polysilicon films have poor characteristics. When a PN junction is formed directly in the substrate material it shares one terminal with other devices (generally referred to as ground) and cannot have both anode and cathode connected to arbitrary voltages. It is also known to form an "isolation region" around an integrated circuit device, in order to isolate the device electrically from other devices in the same substrate. The isolation region consists essentially of a "tub" shaped region of opposite conductivity to the substrate. Such a structure is shown in U.S. Pat. No. 5,156,989 to Williams et al. (see FIG. 10). When a diode is enclosed within an isolation region, depending on the voltage applied to the anode and cathode, a junction between the isolation region and the substrate may become forward-biased. This may cause minority carriers to be injected into the substrate, resulting in latch-up, excessive heating and other undesirable effects. It may also have parasitic bipolar transistors with high current gain, leading to large substrate current. In this sense, prior art diodes formed in a substrate cannot freely float.

SUMMARY OF THE INVENTION

Accordingly, one object of the present invention is to provide a PN junction diode implemented in a junction isolation process and protected from minority carrier injection into the substrate regardless of the voltages applied to the terminals of the diode.

Another object of the present invention is to provide a diode which is capable of forward or reverse operation at voltages above or below a grounded P-type substrate without the use of oxide or dielectric isolation.

In accordance with this invention, a diode formed in a semiconductor substrate includes an anode region and a cathode region, and an isolation region enclosing the anode and cathode. The isolation region has a conductivity opposite to that of the substrate. A first switching device connects the isolation region to the cathode region when the voltage at the cathode exceeds a first predetermined level; and a second switching device connects the isolation region to the substrate when the voltage at the cathode falls below a second predetermined level.

In the preferred embodiment, the first and second switching devices take the form of a CMOS inverter, with the cathode of the diode being connected to the gate of each device. For a P-type substrate, the switching device linking the cathode with the isolation region is an N-channel MOS transistor and the device linking the isolation region with the substrate is a P-channel MOS transistor.

In an alternative embodiment, the switch which connects the isolation region to the substrate is constructed in the form of a high-voltage lateral DMOS device. In a second alternative embodiment, the entire diode is structured to handle high voltages.

The above and other objects, features and advantages of this invention will be apparent from the following detailed description of the invention in conjunction with the drawings.

DETAILED DESCRIPTION OF THE INVENTION

Figure 1:
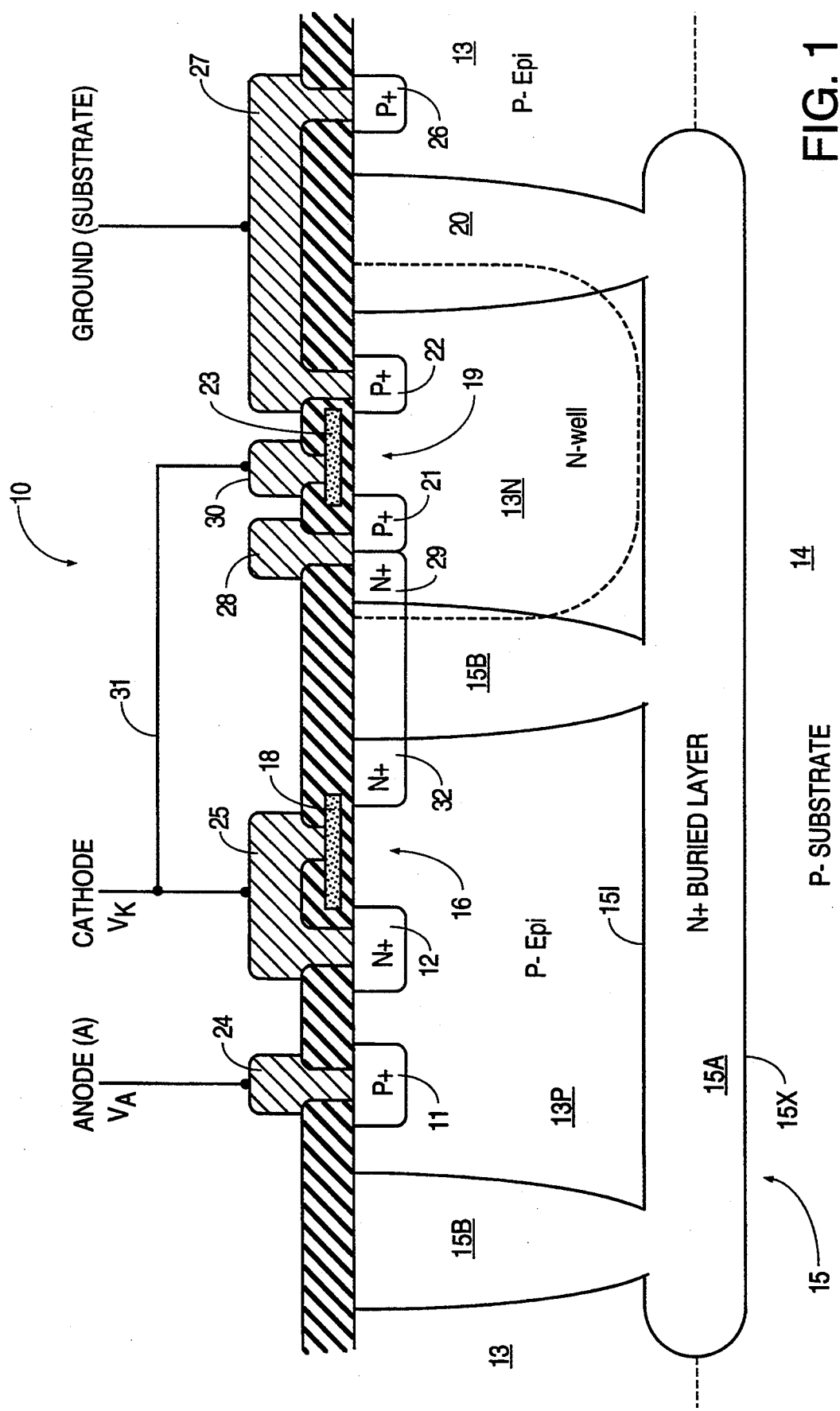
FIG. 1 illustrates a cross-sectional view of a floating-/ode in accordance with the present invention.

FIG. 1 illustrates a cross-sectional view of a diode 10 constructed in accordance with the present invention. Diode 10 includes a P+ anode 11 and an N+ cathode 12, both of which are formed in an enclosed region 13P of a P epitaxial (epi) region 13, overlying a P substrate 14. Anode 11 and cathode 12 may also be formed in a P-body region which is in turn formed in a P epitaxial region. Enclosed region 13P is surrounded by an N+ isolation region 15. Isolation region 15 includes a buried layer 15A and a wraparound region 15B, which together form a "tub" around enclosed region 13P. An inner junction 15I separates enclosed region 13P from isolation region 15, and an outer junction 15X separates P substrate 14 from isolation region 15. Isolation region 15 is preferably formed in the manner described in U.S. Pat. No. 5,156,989 to Williams et al., which is incorporated herein by reference in its entirety.

An N-channel MOS transistor 16 is formed in enclosed region 13P, including cathode 12, an N+ region 32 and a gate 18. A P-channel MOS transistor 19 is formed in an N-well 13N, which is also formed in P epi region 13 and is isolated from P epi region 13 by an N+ isolation region 20. P-channel transistor 19 includes a P+ region 21, a P+ region 22, and a gate 23. The insulation layers separating gates 18 and 23 from enclosed region 13P and N-well 13N, respectively, are made thick enough to withstand significant positive or negative gate voltages.

As further shown in FIG. 1, anode 11 contacts an electrode 24, and cathode 12 and gate 18 contact a common electrode 25. A P+ region 26 outside isolation regions 15 and 20 forms a connection between P substrate 14 and an electrode 27, which is also connected to P+ region 22. An electrode 28 links P+ region 21 to isolation region 15 via an N+ region 29. An electrode 30 contacts gate 23 and is coupled to electrode 25 by a conductive interconnection 31. The N+ isolation regions 15 and 20 are in the shape of a "figure 8" to isolate enclosed regions 13P and N-well 13N from each other and from the substrate. Optionally, NMOS transistor 16 may be annular, surrounding anode 11. Likewise PMOS transistor 19 may be annular, centered on P+ region 22.

Figure 2:
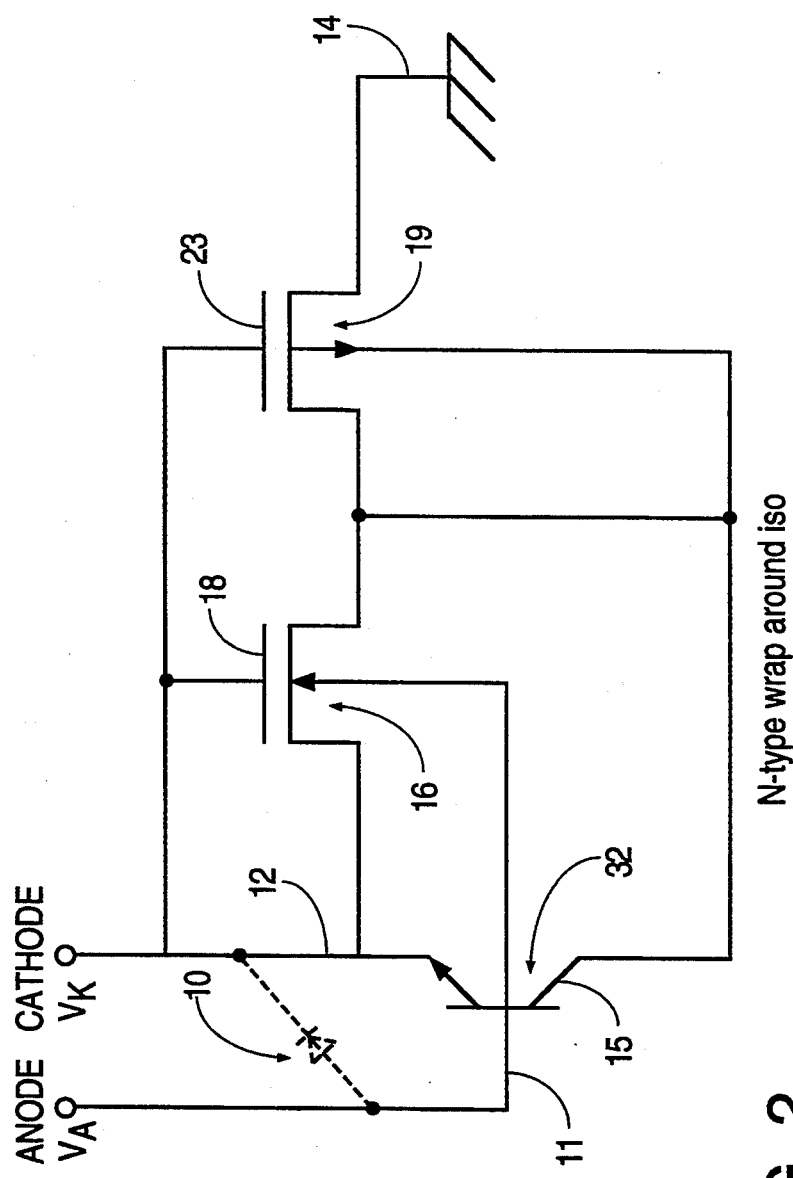
FIG. 2 illustrates an equivalent circuit diagram of the diode device shown in FIG. 1.

FIG. 2 illustrates an equivalent circuit diagram of diode 10. As shown, anode 11, cathode 12 and isolation region 15 form a parasitic NPN transistor 32. The gain of parasitic transistor 32 may be minimized by the doping of P epi region 13, by the formation of a P-body region around the cathode 12, or by the formation of a P-type buried layer above the N-type buried layer. Substrate 14 is grounded (that is, referenced to a potential which is arbitrarily referred to as 0 volts and to which other components may be referenced), a voltage $V_A$ is applied to anode 11, and a voltage $V_K$ is applied to cathode 12.

The operation of diode 10 in the following situations will now be described:

1. $V_A$ and $V_K$ are above ground and diode 10 is reverse-biased ($V_K > V_A > 0$).
2. $V_A$ and $V_K$ are above ground and diode 10 is forward-biased ($V_A > V_K > 0$).
3. $V_A$ and $V_K$ are below ground and diode 10 is reverse-biased ($V_A < V_K < 0$).
4. $V_A$ and $V_K$ are below ground and diode 10 is forward-biased ($V_K < V_A < 0$).

Figure 3A:
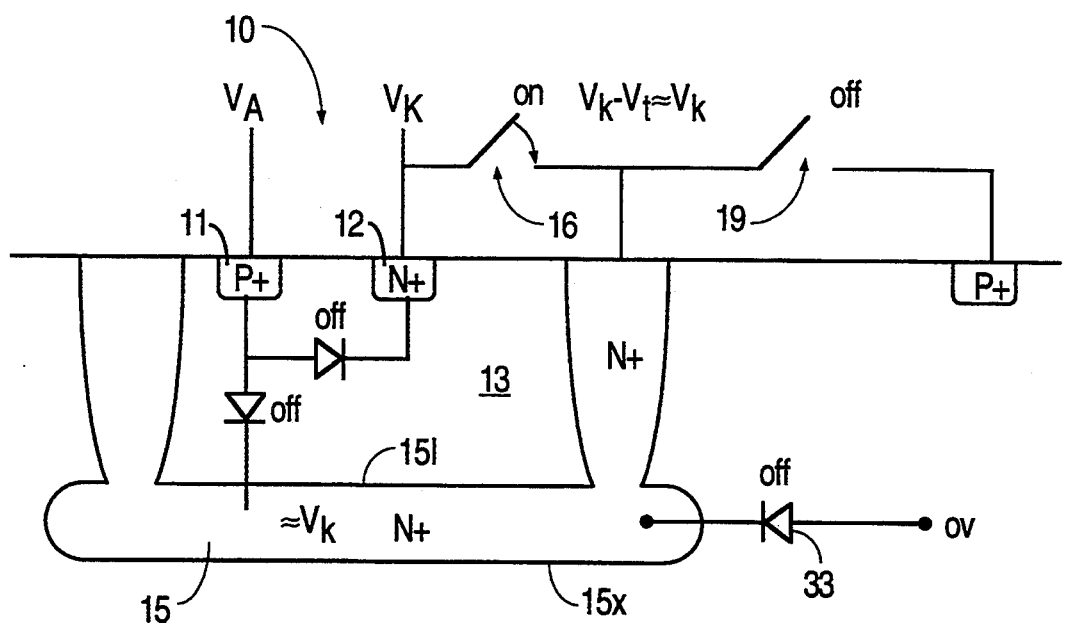
FIG. 3A illustrates the operation of the diode when it is reverse-biased and when its anode and cathode are above ground.
Figure 3B:
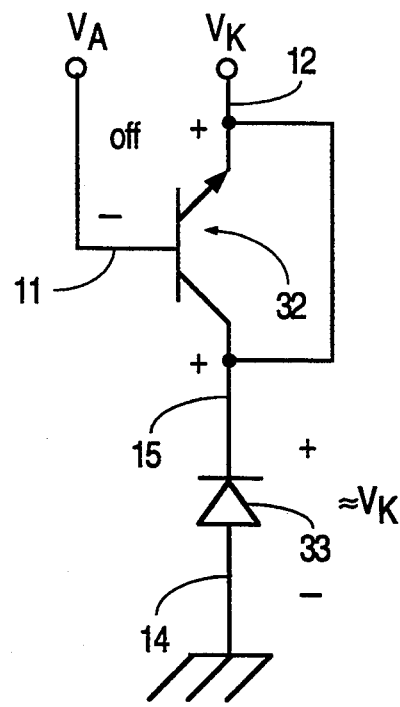
FIG. 3B illustrates an equivalent circuit diagram of the diode in the situation shown in FIG. 3A.

In the first situation ($V_K > V_A > 0$), illustrated in FIGS. 3A and 3B, the junction between cathode 12 and enclosed region 13P is reverse-biased and diode 10 therefore blocks the flow of current. However, voltage $V_K$ is also applied to gate 18 of N-channel transistor 16 and gate 23 of P-channel transistor 19. Since $V_K$ is positive, N-channel transistor 16 shorts isolation region 15 to cathode 12, and P-channel transistor 19 is turned off. Isolation region 15 is therefore at a voltage which is very close to $V_K$, and the outer junction 15X between isolation region 15 and P substrate 14 is reverse-biased. Thus, with outer junction 15X reverse-biased, no minority carrier injection into P substrate 14 occurs. FIG. 3A is a schematic diagram of this situation, with diode 33 representing the reverse-biased junction 15X. As seen from the equivalent circuit of FIG. 3B, the emitter-base and collector-base junctions of the parasitic transistor 32 are reverse-biased, and the emitter and collector are shorted by N-channel transistor 16. Reverse-biased diode 33 is connected between the collector and ground.

Figure 4A:
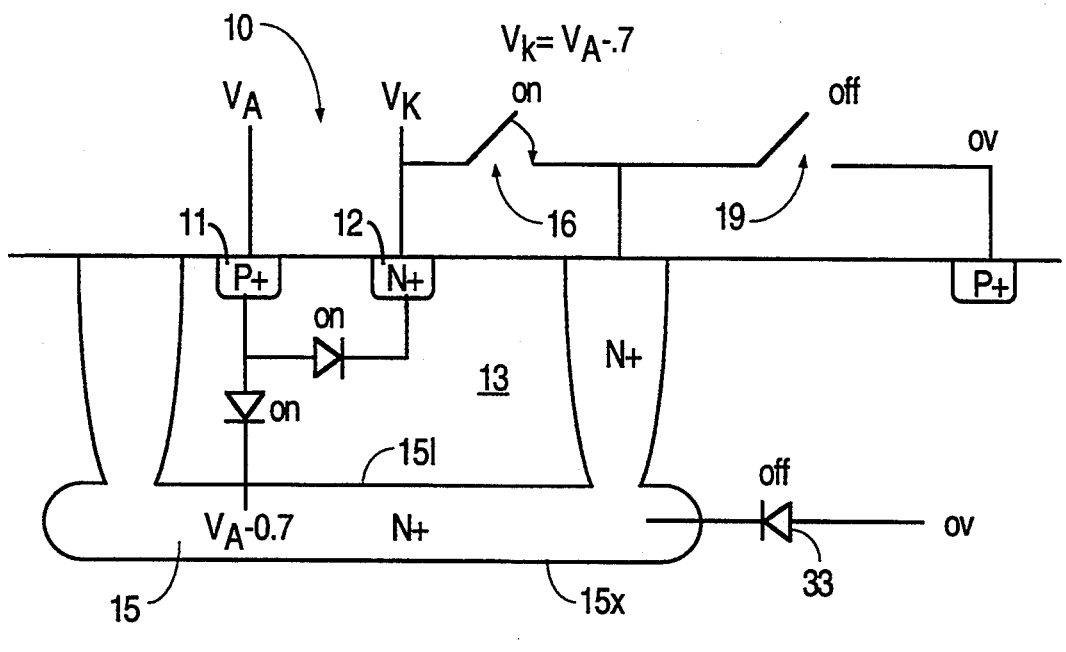
FIG. 4 illustrates the operation of the diode when it is forward-biased and when its anode and cathode are above ground.
FIG. 4B illustrates an equivalent circuit diagram of the diode in the situation shown in FIG. 4A.
Figure 4B:
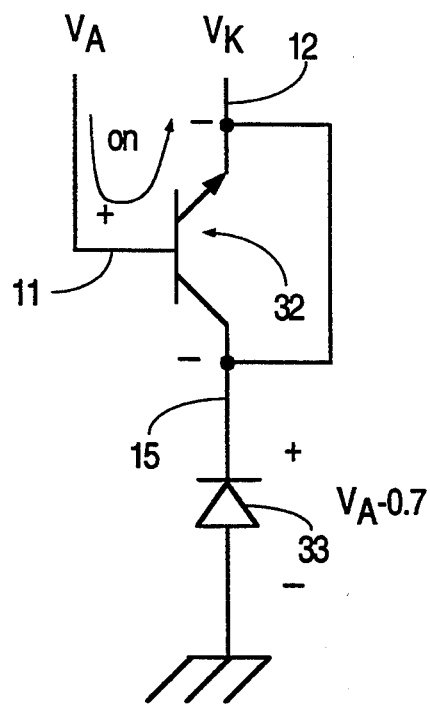

In the second situation, illustrated in FIGS. 4A and 4B, diode 10 is forward-biased, and the anode and cathode potentials are above ground ($V_A > V_K > 0$). Diode 10 therefore conducts and $V_K = V_A - 0.7$ V, where 0.7 V represents the forward voltage drop of the junction between cathode 12 and enclosed region 13P. Again, $V_K$ is applied to gate 18 of N-channel transistor 16, turning it on and shorting isolation region 15 to cathode 12. Isolation region 15 therefore has a voltage of about $V_A - 0.7$ V. P-channel transistor 19 is turned off. Junction 15X between isolation region 15 and P substrate 14, i.e., diode 33 in FIGS. 4A and 4B, is therefore reverse-biased. With outer junction 15X reverse-biased, no minority carriers are injected into P substrate 14. Most of the current flows from anode 11 to cathode 12 because of the higher resistance of the path through isolation region 15 and N-channel transistor 16.

The equivalent circuit is shown in FIG. 4B. The emitter-base junction of parasitic transistor 32 is forward-biased, and the emitter and collector are shorted.

Figure 5A:
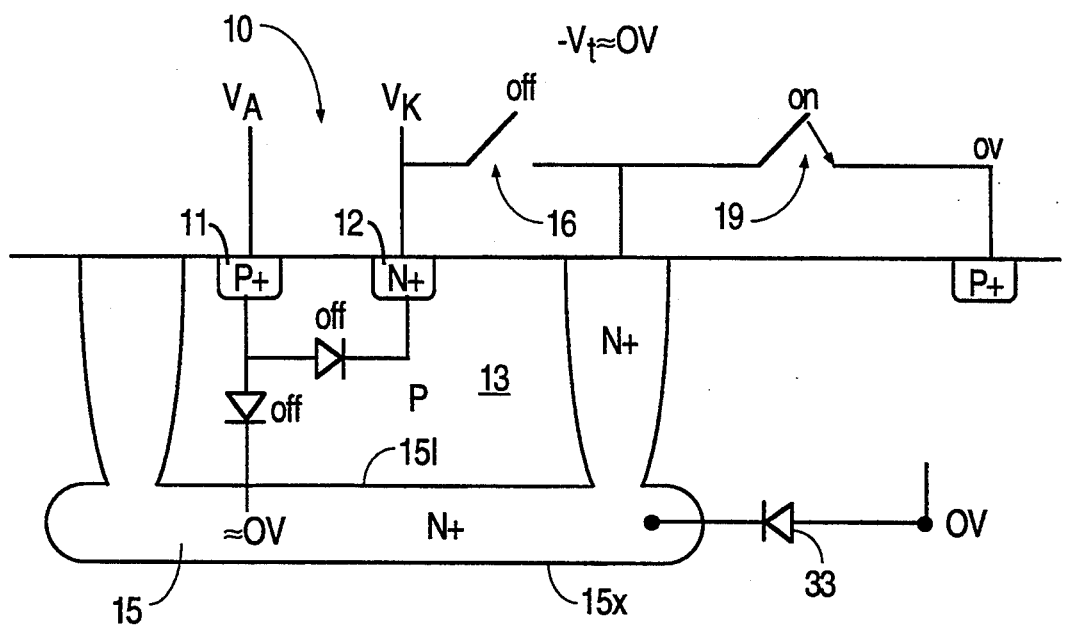
FIG. 5A illustrates the operation of the diode when it is reverse-biased and when its anode and cathode are below ground.

In the third situation, illustrated in FIGS. 5A and 5B, diode 10 is reverse-biased, and the cathode and anode potentials are below ground ($V_A < V_K < 0$). Diode 10 is therefore nonconductive. The negative cathode voltage $V_K$ is applied to gate 23 of P-channel transistor 19, turning it on and shorting P+ region 22 to isolation region 15. Thus isolation region 15 is tied to grounded substrate 14 via electrode 27 and P+ region 26. Inner junction 15I between enclosed region 13P and isolation region 15 is reverse-biased. Because $V_K$ is negative, N-channel transistor 16 is turned off.

Figure 5B:
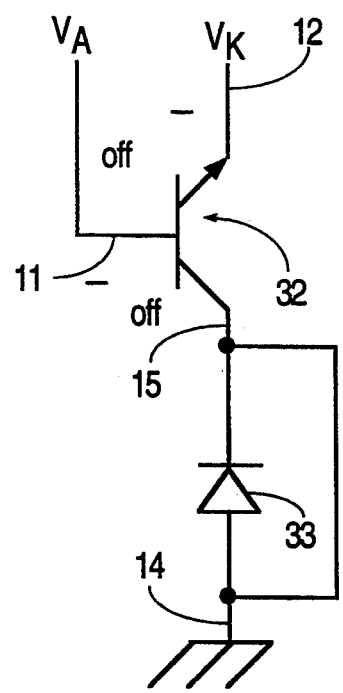
FIG. 5B illustrates an equivalent circuit diagram of the diode in the situation shown in FIG. 5A.

The equivalent circuit is shown in FIG. 5B. The emitter-base and collector-base junctions of parasitic transistor 32 are reverse-biased, and the collector and ground are shorted around diode 33. Again, since junction 15I is reverse-biased and junction 15X is zero biased, no minority carrier injection into P substrate 14 occurs.

Figure 6A:
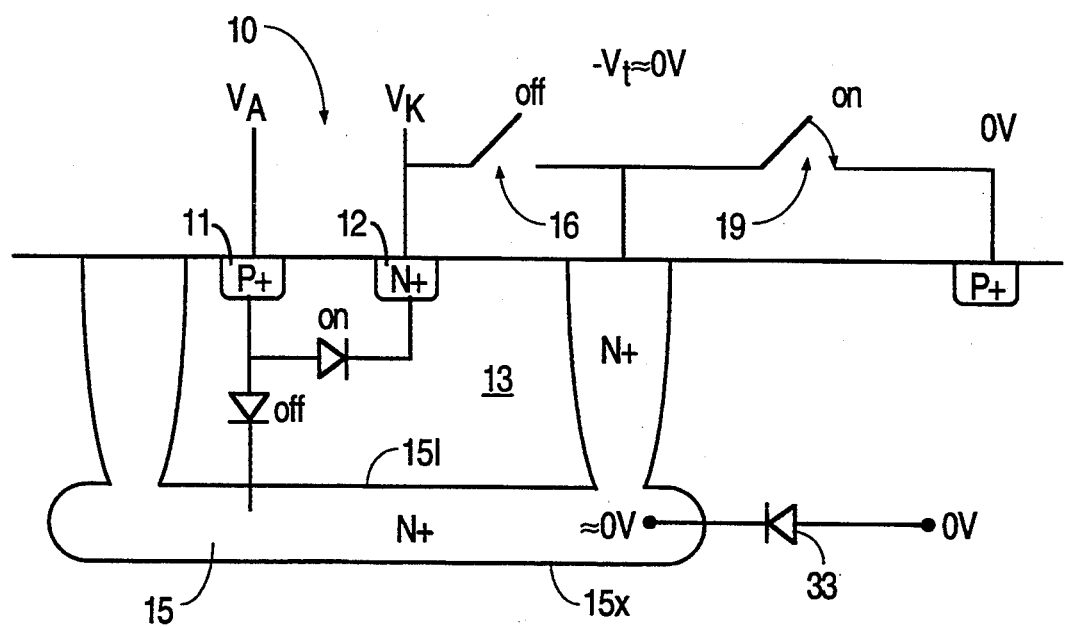
FIG. 6A illustrates the operation of the diode when it is forward-biased and when its anode and cathode are below ground.
Figure 6B:
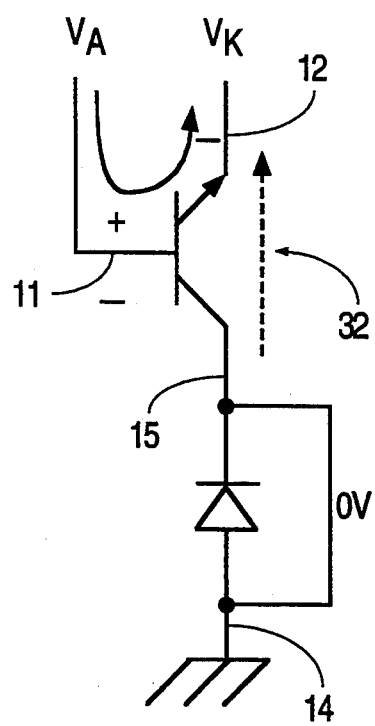
FIG. 6B illustrates an equivalent circuit diagram of the diode in the situation shown in FIG. 6A.

In the fourth and final situation, illustrated in FIGS. 6A and 6B, diode 10 is forward-biased and the cathode and anode potentials are below ground ($V_K < V_A 0$). The junction between cathode 12 and enclosed region 13P is forward-biased. P-channel transistor 19 is turned on and shorts isolation region 15 to the grounded substrate 14. Inner junction 15I between enclosed region 13P and isolation region 15 is reverse-biased. Referring to FIG. 6B, the parasitic transistor 32 is in its forward conduction mode, with its emitter-base junction forward biased and its collector-base junction reverse-biased. The current flowing through parasitic transistor 32 may be limited by the high impedance of N-channel transistor 16. If the current gain ($\beta$) of parasitic transistor 32 is low, this unwanted current can be neglected. Otherwise, the aforementioned current limiting technique or additional series resistance is required. Regardless of the current in diode 10 and in N-channel transistor 16, junction 15X is zero-biased.

Thus, in all four situations an essential condition is preserved, namely, that no PN junction is ever forward-biased onto the substrate. This unique result is achieved by using switching transistors 16 and 19, which together constitute a CMOS inverter, to bias the isolation region 15 correctly. Minority carrier injection into the substrate is avoided. Since the voltages of the cathode and anode are essentially equal when the diode is forward biased, they will both be either above or below ground. When the cathode is below ground and the diode is reverse-biased, the anode must also be below ground, since it must be more negative than the cathode. The only case where the anode and cathode have voltages on opposite sides of zero is when $V_K > 0 > V_A$. This case is identical to the operation shown in FIGS. 3A and 3B.

The diode of this invention is useful in protecting a load from a reversed voltage condition, particularly the integrated circuit devices in a motor vehicle from a reverse-connected battery. This application of the invention is disclosed in U.S. application Ser. No. 08/067,373, which is assigned to the assignee of the present application and which is incorporated herein by reference.

Figure 7:
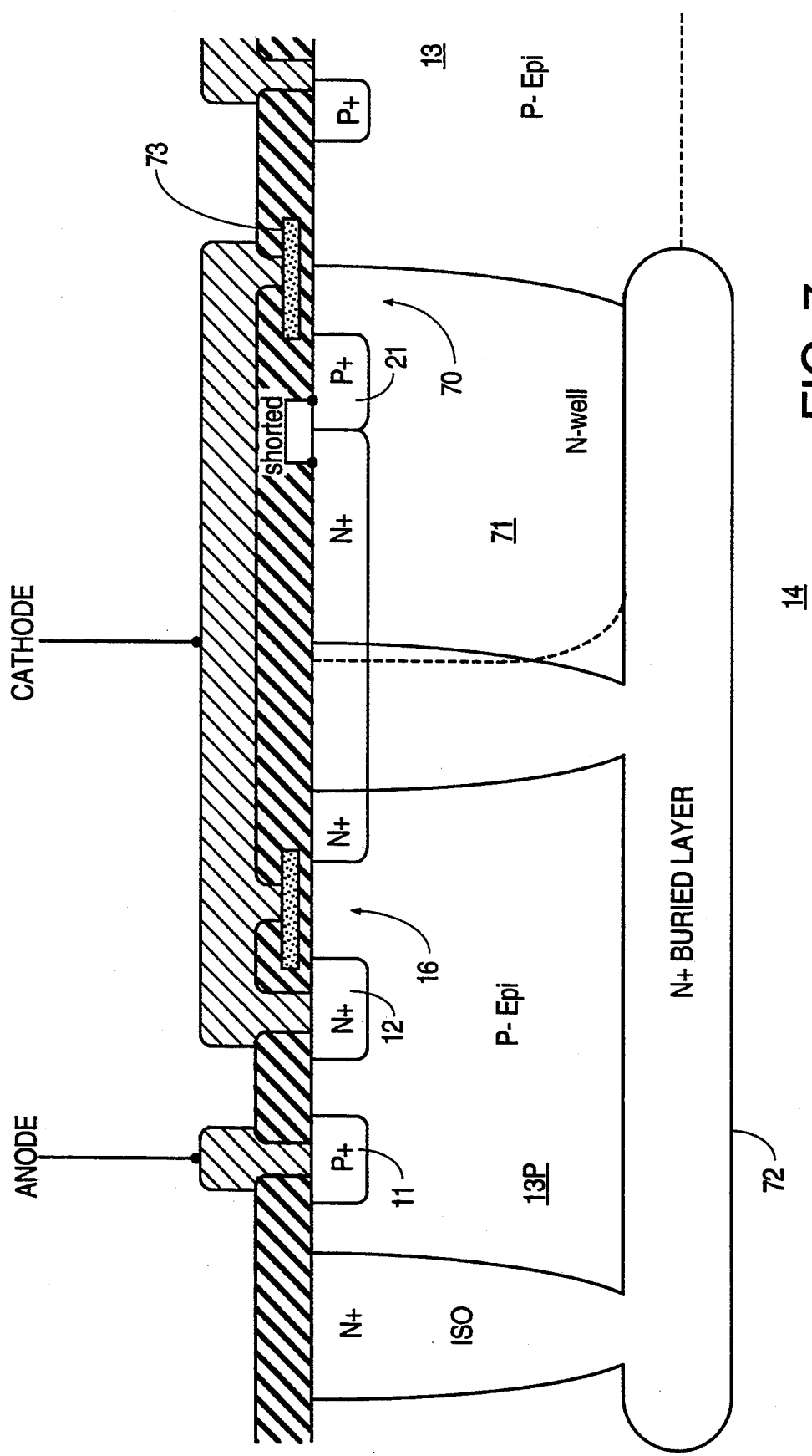
FIG. 7 illustrates a modification to the diode device wherein the PMOS transistor is in the form of a high voltage lateral DMOS device.

FIG. 7 illustrates another embodiment of the diode of this invention, where a modified P-channel device 70 is a lateral double diffused MOS (DMOS) device which has a higher breakdown voltage and does not require special processing steps to achieve higher breakdown. An N-well 71, formed next to an N+ isolation region 72, has a junction with enclosed region 13P. A gate 73 is positioned over the channel region between P+ region 21 and P epi region 13. P epi region 13 is connected to substrate 14.

Figure 8:
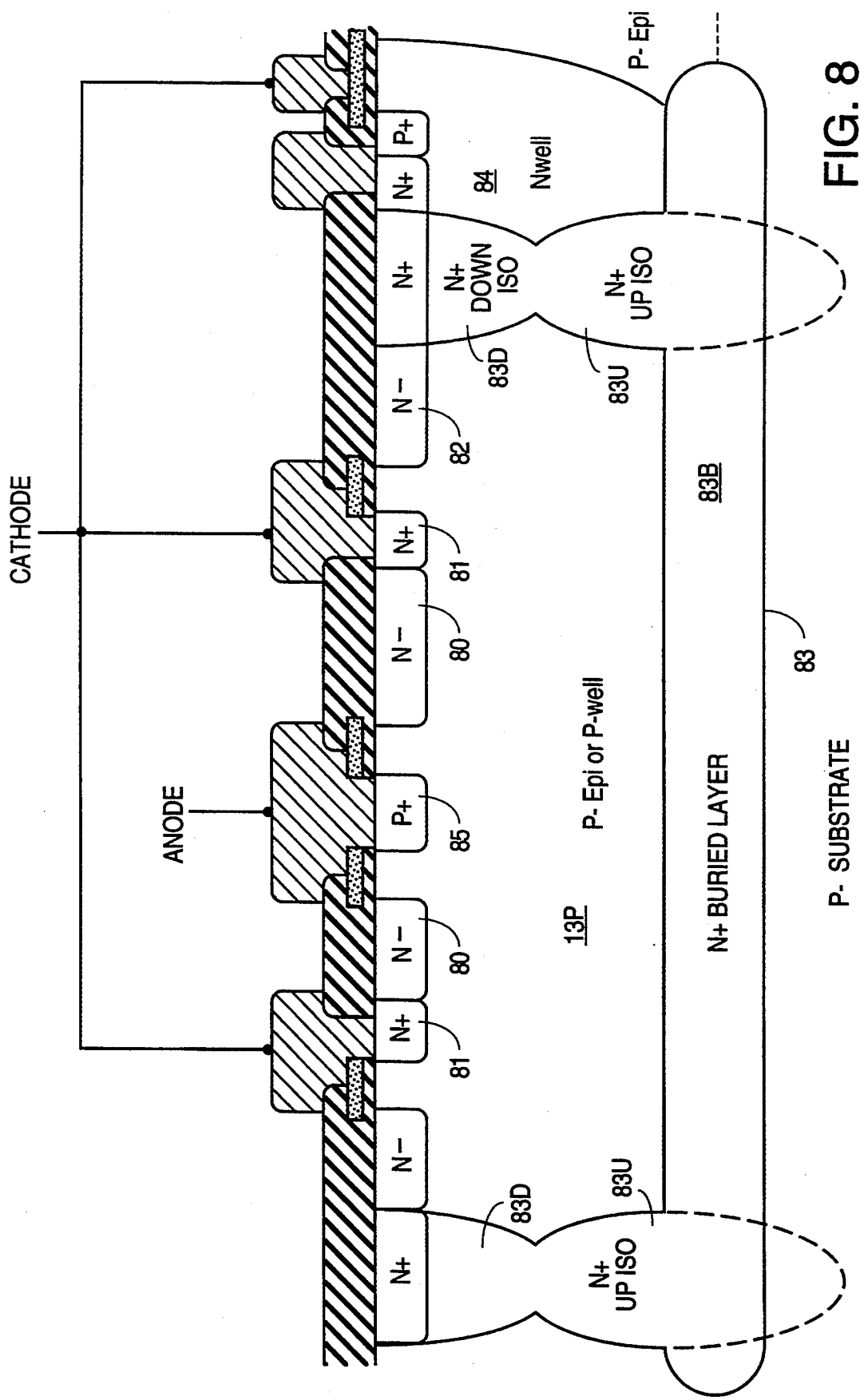
FIG. 8 illustrates another embodiment of the present invention wherein the entire diode device is made capable of handling high voltages.

FIG. 8 illustrates another embodiment of the diode in accordance with the present invention. An annular lightly doped drift region 80 is formed on the inside of a cathode 81 of the diode, which surrounds a central anode 85. A second annular lightly doped drift region 82 is formed next to an isolation region 83. An N-well 84 is formed outside of isolation region 83. Isolation region 83 includes a buried layer 83B, an annular up isolation region 83U, and an annular down isolation region 83D, as described in FIGS. 25A-25P of U.S. Pat. No. 5,156,989 to Williams et al. This structure is capable of handling high voltages because of the lightly doped drift regions.

The foregoing embodiments are intended to be illustrative and not limiting. Many additional embodiments in accordance with this invention will be apparent to those skilled in the art. All such additional embodiments are intended to be within the broad principles of this invention, as defined in the following claims.

I claim:

1. A junction-isolated diode formed in a semiconductor substrate of a first conductivity type, said diode comprising:
   an isolation region of a second conductivity type enclosing an enclosed region of said substrate, said enclosed region being of said first conductivity type, said isolation region separating said enclosed region from a region of said substrate outside of said isolation region;
   a cathode region and an anode region formed in said enclosed region;
   first switching means for connecting said isolation region to said cathode region when a voltage at said cathode region exceeds a first predetermined level; and
   second switching means for connecting said isolation region to said substrate when the voltage at said cathode region falls below a second predetermined level.

2. A diode as in claim 1, wherein said first and second switching means comprise a CMOS inverter.

3. A diode as in claim 2, wherein said first switching means comprises a N-channel MOS transistor and said second switching means comprises a P-channel MOS transistor, said cathode region being connected to a gate of said N-channel MOS transistor and a gate of said P-channel MOS transistor.

4. A diode as in claim 3, wherein said enclosed region comprises an epitaxial region of said substrate.

5. A diode as in claim 2, wherein said second switching means is at least partially located in a well of said second conductivity type in said substrate.

6. A diode as in claim 5 further comprising a second isolation region of said second conductivity type, said second isolation region enclosing said well.

7. A diode as in claim 1, wherein said second switching means comprises a DMOS device.

8. A diode as in claim 1 wherein said anode comprises a region of said first conductivity and said cathode comprises a region of said second conductivity.

9. A diode as in claim 8 wherein said cathode is formed in an annular shape and surrounds said anode.

10. A diode as in claim 9 further comprising an annular drift region located adjacent an inside edge of said cathode, said drift region being of said second conductivity type and less heavily doped than said cathode.

11. A diode as in claim 10 further comprising a second drift region of said second conductivity type, said second drift region being in an annular shape and located adjacent an inside edge of said isolation region, said second drift region being less heavily doped than said isolation region.

12. A junction-isolated diode comprising:
   a semiconductor substrate of a first electrical conductivity type and having a top surface;
   a covering layer of semiconductor material of said first conductivity type, having a top surface and overlying and being contiguous to the top surface of the substrate and defining an interface between the substrate and the covering layer;
   a heavily doped buried layer of a second electrical conductivity type adjacent to a portion of the interface between the substrate and covering layer;
   a wraparound region in the covering layer that is substantially annular in shape and extends substantially from the buried layer to the top surface of the covering layer, the wraparound region being heavily doped and of second conductivity type;
   wherein the buried layer, the wraparound region and the top surface of the covering layer define and bound an enclosed region of the covering layer that has a top surface;
   wherein said enclosed region includes a first region of said first conductivity type and a first MOS transistor, said first MOS transistor comprising a second region of said second conductivity type, a third region of said second conductivity type, and a first gate overlying and separated from a first channel region between said second and third regions;
   wherein said covering layer outside of said wraparound region includes a well of said second conductivity type, said well including a second MOS transistor, said second MOS transistor comprising a fourth region of said first conductivity type, a fifth region of said first conductivity type, and a second gate overlying and separated from a second channel region between said fourth and fifth regions, said fourth region being electrically connected to said wraparound region and said fifth region being electrically connected to a portion of said covering layer outside of said enclosed region and said well; and
   wherein said first region is electrically connected to a first diode terminal, and wherein said second conductive region, said first gate and said second gate are electrically connected together and to a second diode terminal, and wherein said fifth region is electrically connected to a ground voltage.

13. The junction-isolated diode of claim 12 further comprising a sixth region of said first conductivity type positioned in said portion of said covering layer outside of said enclosed region and said well, wherein said fifth region is electrically connected to said sixth region.

14. The junction-isolated diode of claim 13 wherein said buried layer extends laterally underneath said well and adjoins an isolation region of said second conductivity type such that said well is enclosed by a section of said wraparound region, said buried layer and said isolation region.

15. The junction-isolated diode of claim 12 wherein said third region extends through said wraparound region and is electrically connected to said fourth region.

16. The junction-isolated diode of claim 12 wherein said first conductivity type is P-type, said second conductivity type is N-type, said first diode terminal is an anode, and said second diode terminal is a cathode.

17. The junction-isolated diode of claim 16 wherein said first MOS transistor is turned on and said second MOS transistor is turned off when a voltage at said cathode is above said ground voltage.

18. The junction-isolated diode of claim 16 wherein said first MOS transistor is turned off and said second MOS transistor is turned on when a voltage at said cathode is below said ground voltage.

19. The junction-isolated diode of claim 12 wherein said covering layer is formed of expitaxial material.

20. A junction-isolated diode comprising:
a semiconductor substrate of a first electrical conductivity type and having a top surface;
a covering layer of semiconductor material of said first conductivity type, having a top surface and overlying and being contiguous to the top surface of the substrate and defining an interface between the substrate and the covering layer;
a heavily doped buried layer of a second electrical conductivity type adjacent to a portion of the interface between the substrate and covering layer;
a wraparound region in the covering layer that is substantially annular in shape and extends substantially from the buried layer to the top surface of the covering layer, the wraparound region being heavily doped and of second conductivity type;
wherein the buried layer, the wraparound region and the top surface of the covering layer define and bound an enclosed region of the covering layer that has a top surface;
wherein said enclosed region includes a first region of said first conductivity type and a first MOS transistor, said first MOS transistor comprising a second region of said second conductivity type, a third region of said second conductivity type, and a first gate overlying and separated from a first channel region between said second and third regions;
wherein said covering layer outside of said wraparound region includes a well of said second conductivity type, said well including a second MOS transistor, said second MOS transistor comprising a fourth region of said first conductivity type separated by a second channel region from a portion of said covering layer outside of said enclosed region and said well and a second gate overlying said second channel region, said fourth region being electrically connected to said wraparound region; and
wherein said first region is electrically connected to a first diode terminal, and wherein said second conductive region, said first gate and said second gate are electrically connected together and to a second diode terminal, and wherein said portion of said covering layer outside of said enclosed region and said well is electrically connected together and to a ground voltage.

21. The junction-isolated diode of claim 20 wherein said second region is formed in an annular shape and said first region is surrounded by said second region, said diode further comprising a drift region of annular shape and adjoining an inside circumference of said second region, said drift region being of said second conductivity type and being less heavily doped than said second region.

22. The junction-isolated diode of claim 21 further comprising a second drift region of annular shape and adjoining an inside circumference of said wraparound region, said second drift region being of said second conductivity type and being less heavily doped than said second region.

* * * * *

UNITED STATES PATENT AND TRADEMARK OFFICE
CERTIFICATE OF CORRECTION

PATENT NO. : 5,414,292
DATED : May 9, 1995
INVENTOR(S) : Richard K. Williams

It is certified that error appears in the above-identified patent and that said Letters Patent is hereby corrected as shown below:

Col. 2, line 10, delete "/ode" and insert --diode--.

Col. 2, line 17, after "4" insert --A--.

Col. 4, line 28, delete "$V_K<V_A O$" and insert --$V_K<V_A<O$--.

Signed and Sealed this

Fourteenth Day of November, 1995

Attest:

BRUCE LEHMAN

Attesting Officer        Commissioner of Patents and Trademarks